United States Patent
Gates et al.

(10) Patent No.: US 7,088,003 B2
(45) Date of Patent: Aug. 8, 2006

(54) STRUCTURES AND METHODS FOR INTEGRATION OF ULTRALOW-K DIELECTRICS WITH IMPROVED RELIABILITY

(75) Inventors: Stephen M. Gates, Ossining, NY (US); Son Nguyen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 10/780,554

(22) Filed: Feb. 19, 2004

(65) Prior Publication Data

US 2005/0184397 A1 Aug. 25, 2005

(51) Int. Cl.
*H05K 3/20* (2006.01)
*H05K 1/11* (2006.01)

(52) U.S. Cl. .............. 257/774; 257/E23.144; 257/E23.167; 257/E23.052; 257/744; 257/751; 257/758; 257/700; 257/701; 257/702; 257/703; 174/266; 174/257; 29/852; 29/831

(58) Field of Classification Search ........ 257/700–703, 257/758, 751, 774, 773, E23.144, E23.167, 257/E23.145, E23.052; 174/266, 257; 29/852, 29/831
See application file for complete search history.

(56) References Cited

U.S. PATENT DOCUMENTS

| | | | | |
|---|---|---|---|---|
| 6,140,220 | A * | 10/2000 | Lin ............................. | 438/618 |
| 6,348,733 | B1 * | 2/2002 | Lin ............................. | 257/758 |
| 6,444,568 | B1 * | 9/2002 | Sundararajan et al. ...... | 438/627 |
| 6,541,842 | B1 * | 4/2003 | Meynen et al. ............. | 257/632 |
| 6,933,246 | B1 * | 8/2005 | Buchanan et al. .......... | 438/778 |
| 6,949,456 | B1 * | 9/2005 | Kumar ....................... | 438/619 |
| 2005/0059231 | A1 * | 3/2005 | Nakagawa et al. ......... | 438/622 |
| 2005/0062165 | A1 * | 3/2005 | Saenger et al. ............. | 257/774 |
| 2005/0064701 | A1 * | 3/2005 | Dalton et al. ............... | 438/627 |
| 2005/0074961 | A1 * | 4/2005 | Beyer et al. ................ | 438/619 |
| 2005/0082089 | A1 * | 4/2005 | Grunow et al. ............. | 174/266 |
| 2005/0107274 | A1 * | 5/2005 | Daviot ....................... | 510/175 |
| 2005/0130405 | A1 * | 6/2005 | Spencer et al. ............. | 438/624 |
| 2005/0239278 | A1 * | 10/2005 | Li et al. ..................... | 438/618 |
| 2005/0266681 | A1 * | 12/2005 | Dalton et al. ............... | 438/637 |

\* cited by examiner

*Primary Examiner*—Alexander Oscar Williams
(74) *Attorney, Agent, or Firm*—Connolly Bove Lodge & Hutz LLP; Daniel P. Morris

(57) ABSTRACT

An improved back end of the line (BEOL) interconnect structure comprising an ultralow k (ULK) dielectric is provided. The structure may be of the single or dual damascene type and comprises a dense thin dielectric layer (TDL) between a metal barrier layer and the ULK dielectric. Disclosed are also methods of fabrication of BEOL interconnect structures, including (i) methods in which a dense TDL is provided on etched opening of a ULK dielectric and (ii) methods in which a ULK dielectric is placed in a process chamber on a cold chuck, a sealing agent is added to the process chamber, and an activation step is performed.

10 Claims, 4 Drawing Sheets

STRUCTURES AND METHODS FOR INTEGRATION OF ULTRALOW-K DIELECTRICS WITH IMPROVED RELIABILITY

FIELD OF THE INVENTION

The present invention generally relates to integrated circuits (ICs), and more particularly to interconnect structures, including multilevel interconnect structures fabricated by damascene methods, in which the dielectric is an ultralow k (ULK) dielectric having a dielectric constant of, for example, about 1.5 to about 3.0. Commonly, pores are present in these ultralow k dielectrics.

The present invention describes improved interconnect structures based on metal damascene wiring within these ULK dielectrics, the structures being improved by sealing or closing of the pores after etching the single damscene or dual damascene openings. The preferred metal is copper, but other low resistivity metals may be used. Methods to make these structures are also described.

The present invention also describes improved interconnect structures based on copper wiring with Air Gaps (AG) for high performance IC chips. Methods to make said improved AG structures are also described.

BACKGROUND OF THE INVENTION

Generally, semiconductor devices include a plurality of circuits that form an integrated circuit fabricated on a single substrate, such as a silicon crystal substrate. A complex network of signal paths will normally be routed to connect the circuit elements distributed on the surface of the substrate. Efficient routing of these signals across the device typically requires the formation of multi-level or multi-layered interconnection schemes such as, for example, dual damascene wiring structures based on copper. Copper based interconnects are desirable due to their efficacy in providing high speed signal transmission between large numbers of transistors on a complex semiconductor chip. Within the interconnection structure, metal vias run perpendicular to the substrate and metal lines run parallel to the substrate. Further enhancement of the speed of signals and reduction of interaction of signals in adjacent copper lines (known as "cross-talk") can be achieved in new IC product chips by surrounding the copper lines and vias in a low k or ultralow k (ULK) dielectric, having a dielectric constant of about 1.5 to about 3.0. Still further speed enhancement can be achieved using an air gap (AG) structure with the dielectric constant of air=1.0.

Presently, interconnect structures formed on an integrated circuit chip consist of at least about 2 to 10 wiring levels. In one class of structures, a low dielectric constant (k) material having a dielectric constant less than 3.0 is used.

However, reliability problems are often associated with these structures.

During integration, reliability stress, or extended use, a chip interconnect structure made in a ULK dielectric may fail or degrade due to poor liner barrier quality for the metal liner barrier between Cu and the ULK dielectric. This poor quality usually results from defects in the liner barrier, allowing Cu or Cu+ to penetrate the dielectric and allowing oxidizing species ($H_2O$, $O_2$, etc.) to interact with the Cu. The defects and roughness are typically due to uneven coverage during the liner barrier deposition, for example, the presence of pores and roughness on the ULK dielectric can result in small regions where the liner barrier is thin or discontinuous.

Also, it may be difficult to deposit the liner barrier at the bottom of high aspect ratio vias, so the thin or discontinuous liner regions commonly are formed at the bottom of said vias, near the interface where the via meets the line below.

Thus, there is a need to reduce or prevent defects in the liner barrier that are caused by open pores and extreme roughness on the surfaces of etched openings.

In addition, interconnect structures for high performance may use an air gap (AG) or air bridge to achieve the lowest dielectric constant.

Reliability problems with these structures also usually involve Cu oxidation, because the metal liner barrier may be too thin to prevent Cu oxidation, or defects may form in the liner barrier during manufacturing due to particulates, lithography defects, or other sources. Also, dielectric breakdown in the AG may occur.

Thus, there is a need in AG structures to improve reliability by adding protection of the Cu against oxidation, and also to prevent dielectric breakdown.

SUMMARY OF THE INVENTION

The present invention provides improved back end of the line (BEOL) interconnect structures comprising an ultralow k (ULK) dielectric. The structures comprise a dense thin dielectric layer (TDL) between a metal liner barrier layer and the ULK dielectric and the TDL comprises a film that comprises a different material than the material of the ULK dielectric.

The interconnect structures may be of the dual or single damascene type and the ULK dielectric can, for example, have a dielectric constant of up to about 3.0, such as a dielectric constant from about 1.5 to about 3.0.

The TDL preferably: is essentially defect free, exhibits conformal deposition on etched openings, has hermetic barrier capability, has a density ranging from about $0.5 \times 10^{23}$ atoms/cm$^3$ to about $1.7 \times 10^{23}$ atoms/cm$^3$, and has a thickness of up to about 5 nanometers, such as a thickness ranging from about 0.5 nanometers to about 5 nanometers, such as from about 1 nanometer to about 3 nanometers.

The present invention further relates to improved methods of fabricating BEOL interconnect structures. In one embodiment, a method is provided in which a dense, hermetic, TDL is provided on etched openings of a ULK dielectric. In another embodiment, a method is provided in which a low k TDL is provided on etched openings of a ULK dielectric. In the latter method, a structure containing a ULK dielectric is placed in a process chamber on a cold chuck at a temperature ranging from about −200° C. to about 25° C., a sealing agent is added to the process chamber, and an activation step is performed.

BRIEF DESCRIPTION OF THE DRAWINGS

These and other features of the present invention will become apparent upon consideration of the following detailed description of the invention when read in conjunction with the drawings, in which.

DETAILED DESCRIPTION OF THE INVENTION

Figure 1:
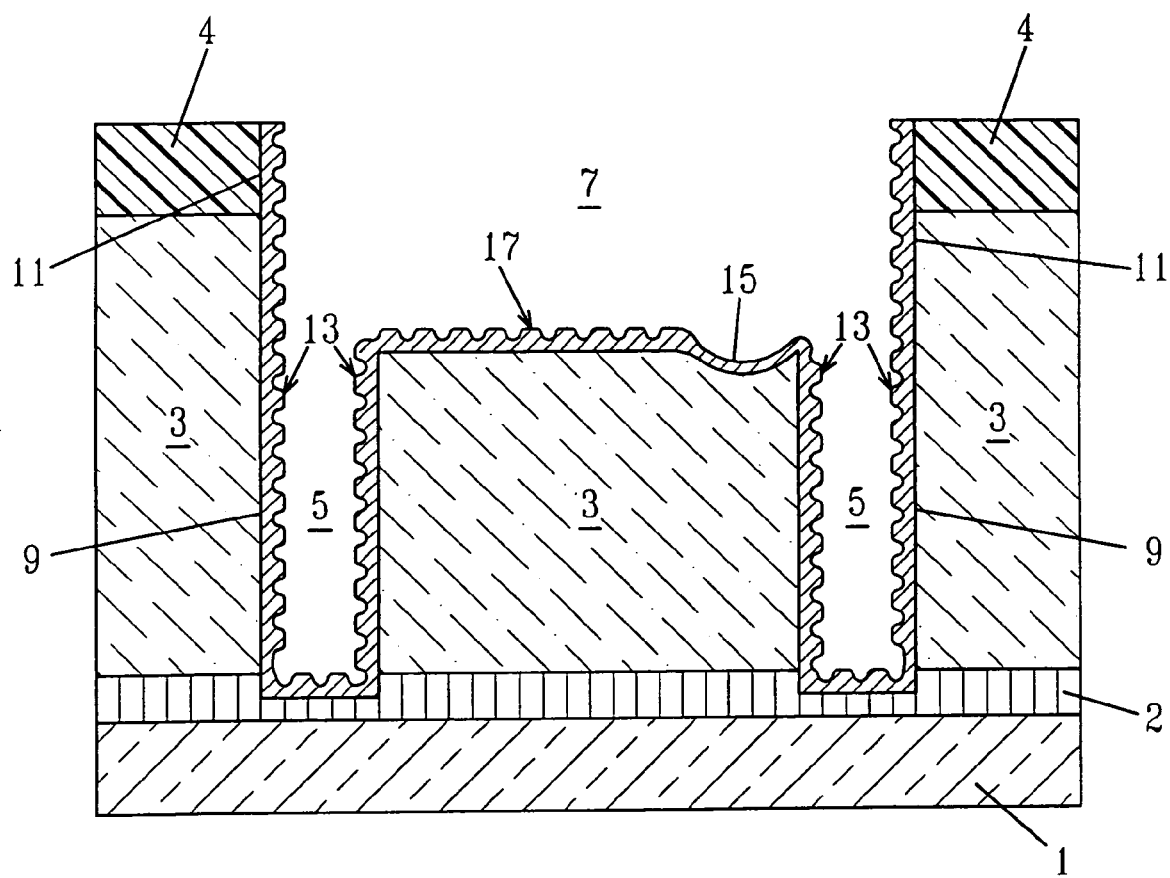
FIG. 1 shows a schematic cross-sectional view of a Dual damascene interconnect level during fabrication, after the etched openings are formed, in which roughness of the sidewalls and line bottom is shown.

The present invention generally relates to improved integrated circuits (ICs), and more particularly to improved interconnect structures, including multilevel interconnect structures fabricated by damascene methods, in which the dielectric is an ultralow k (ULK) dielectric having a dielectric constant ranging, for example, from about 1.5 to about 3.0. Commonly, pores are present in such ULK materials. The present invention provides methods of sealing or closing the pores after etching, such as, for example, sealing or closing the pores after the etching of single damascene or dual damascene openings.

The methods of this invention can provide interconnect structures having improved reliability because at least two critical modes for reliability failure may generally be eliminated. These failure modes include acceleration of the time dependant dielectric breakdown (TDDB) of the ULK dielectric due to metal ion (such as Cu+) or metal atoms (Cu) present in the ULK dielectric, resulting in current flow between adjacent metal features. A second common failure mode is localized oxidation of the conductive metal (such as Cu) vias and lines by oxidizers penetrating from the ULK into the conductive metal, causing the resistance of said metal to increase. Both of the aforesaid failure modes are typically caused by small regions where the liner barrier is thin or discontinuous. Cu species can penetrate the ULK dielectric and oxidizers attack the Cu lines through the locations where the liner barrier is thin or discontinuous.

Thus, the present invention also can provide BEOL interconnect structures of the dual or single damascene type formed in dielectrics having a dielectric constant of up to about 3.0 that are very stable and reliable in electrical characteristics. The present structures exhibit reduced leakage current, stable metal conductor (Cu) resistance, stable line-to-line capacitance, and related characteristics during field operation or reliability stress.

In addition, the present invention can provide BEOL interconnect structures based on an air gap that are very stable and reliable in electrical characteristics, such as: line-to-line leakage, metal conductor (such as Cu) resistance and capacitance, and avoidance of dielectric breakdown during field operation or reliability stress.

The present invention can further provide methods for improved fabrication of BEOL interconnect structures of the dual or single damascene type, or of the air gap type, in which a thin dielectric barrier separates the dielectric from the metal conductor (such as Cu).

Integrated circuits typically have interconnect levels, each level consisting of metallic lines and vias that are of a dual damascene (via plus next level conductor) wiring interconnect structure for use on the IC chip. The metallic lines and vias are comprised of the same or different conductive material. Suitable conductive materials include, but are not limited to, W, Cu, Al, Ag, Au, and mixtures and alloys of the same. A highly preferred material is Cu. Alloys based on copper with an additive metal (such as Ti or Sn) may also be used.

Fabrication of a dual damascene level is described in reference to FIG. 1, in which a substrate 1, and a etch stop/barrier layer 2, are shown. On the etch stop/barrier is deposited the interlayer dielectric (ILD) 3, and an optional hardmask 4, is atop the ILD. Within the ILD, are openings formed by, for example, reactive ion etching including the via opening 5, and the line opening 7. The sidewall of the via opening is 9, while the sidewall of the line opening is 11. Roughness on the sidewall surfaces is indicated as 13, and a case of extreme roughness due to an open pore is shown as 15.

Roughness may be greater on the trench bottom 17, compared to the sidewall 13, due to direct exposure of the trench bottom to ion bombardment during the etch step under some etch conditions. Generally, roughness and open pores 15 can be formed throughout the exposed surfaces of the etched openings 5 and 7. The substrate 1, may comprise a semiconductor wafer or chip comprising, for example, a semiconductor material selected from the group consisting of Si, SiGe, Si/SiGe, Si/SiO$_2$/Si, GaAs, and alloys, mixtures, or multilayers of the same. The substrate may be of the n or p-type depending on the desired device to be fabricated. Moreover, the substrate may contain various isolation and/or device regions either formed in the substrate or on a surface thereof. The substrate may also contain metallic pads on the surface thereof. In addition to silicon-containing semiconductor materials, the substrate may also be a circuit that includes complementary metal oxide semiconductor (CMOS) devices therein.

Techniques and parameters for forming the dual damascene openings are known. For example, openings for defining lines and vias can be formed utilizing conventional lithography (including applying a photoresist to a surface of the low-k organic dielectric layer) and etching. The etching step can include conventional dry etching for example, reactive ion etching, ion beam etching and/or plasma etching. The photoresist can then be stripped from the layer utilizing conventional stripping processes. FIG. 1 shows the openings after the etch and resist strip steps.

To complete the dual damascene structure, a conductive metal-based liner barrier can be deposited on the exposed surfaces of the openings. This conductive metal-based liner barrier may be formed using conventional deposition processes such as, for example, chemical vapor deposition (CVD), physical vapor deposition (PVD), sputtering, plating, evaporation, or chemical solution deposition. The liner barrier may be a bilayer of a refractory metal nitride, such as, for example, tantalum nitride (TaN) and a refractory metal, such as, for example, tantalum (Ta). TiN, WN, W, Re, Ru, and related materials may also be used. Optionally, Si may be added forming a ternary alloy barrier such as TiSiN.

A metal, for example Cu, can then be added by electroplating or one of the aforementioned deposition processes. Preferably, the metal is in strong adhesive contact with a liner metal, such as Ta, Ru, or Re, which is in turn in contact with a metal nitride layer, which metal nitride layer is adjacent to the ULK dielectric and is in strong adhesive contact with said dielectric.

The conductive filled structure can then be subjected to a conventional planarization process in which any residual conductive metal and/or liner outside the opening is substantially removed. For example, chemical mechanical polishing (CMP) may be used and after CMP, the top horizontal portions of the metallic lines are approximately coplanar with the top surface of the first layer.

A diffusion barrier/etch stop layer can then be deposited as a continuous layer on the top surface thereof to complete the interconnect level. Said diffusion barrier layer may be comprised of any insulating material which is capable of preventing one of the above mentioned conductive metals from diffusing into the dielectric layers of the interconnect level. Said diffusion barrier layer, may, for example, be comprised of an amorphous alloy selected from SiN, SiCN, and SiC, and/or the hydrogenated forms of these materials (SiNH, SiCNH, SiCH).

Figure 2:
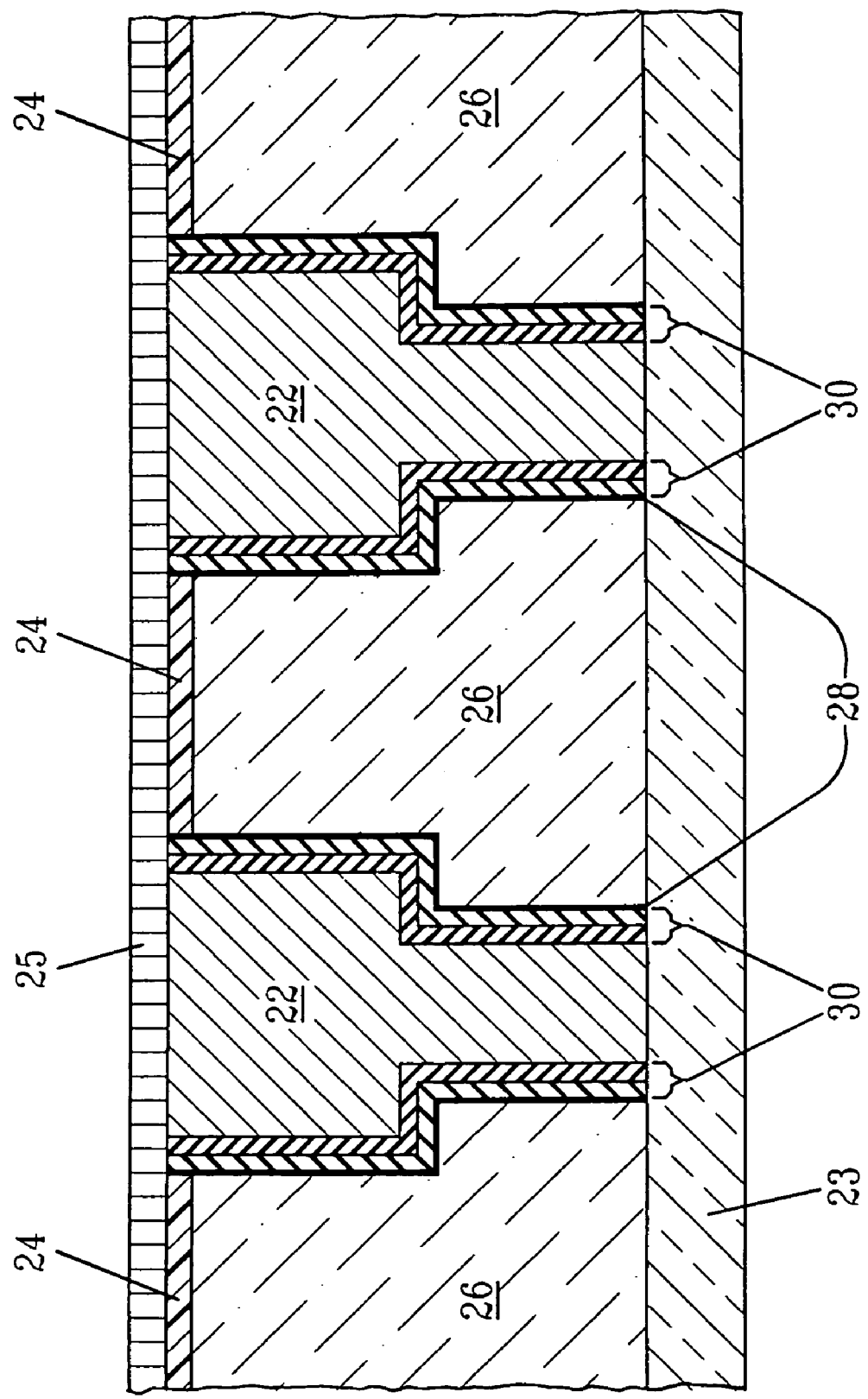
FIG. 2 shows a schematic cross-sectional view of a dual damascene interconnect level of the present invention, in which a thin dielectric layer (TDL) is shown between the ULK dielectric and the metal features.

An embodiment falling within the scope of the present invention is now described with reference to FIG. 2. A ULK dielectric layer 26 is deposited atop a substrate 23, and there are etched dual damascene openings in the ULK dielectric. The openings may be single damascene within the invention, but the dual damascene case is described in detail. Throughout the dual damascene openings between the dielectric and the metal (such as Cu) features 22 is a thin dielectric layer (TDL) 28.

Between the TDL and the metal features 22 is a metal/metal nitride liner barrier 30, which may be a single layer or may be a bi- or multilayer, comprising, for example, TaN, and/or Ta. Preferably, a bilayer is utilized in which the metal nitride layer is adjacent to the ULK dielectric and is in strong adhesive contact with said dielectric, while the metal liner, comprising, for example, Ta, Ru, or Re, is adjacent to the metal features and is in strong adhesive contact with said metal features. Atop the dielectric is an optional hardmask layer 24. Atop the optional hardmask and the metal features is a diffusion barrier/etch stop 25.

The TDL 28 should comprise a dense, film having hermetic barrier capability that is preferably amorphous and essentially defect free, such as without pinholes or micro channels. In addition to having hermetic barrier capability, such film should preferably be a good barrier to Cu or Cu+ migration. Other properties of the TDL 28 preferably include: conformal deposition in the etched openings, especially at the bottom of vias, moisture ($H_2O$) resistance and/or hydrophobic character, and good adhesion to the liner layer and the blanket barrier/etch stop. The TDL may also have a low dielectric constant, for example, a dielectric constant of less than about 7, such as a dielectric constant ranging from about 2.8 to about 7, such as from about 2.8 to about 5.

As used herein, the term "dense film having hermetic barrier capability" means a material: (i) having a density measured by Rutherford Backscattering spectroscopy (RBS) and Forward Recoil spectroscopy (for hydrogen) ranging from about $0.5 \times 10^{23}$ atoms/cm$^3$ to about $1.7 \times 10^{23}$ atoms/cm$^3$, and (ii) that does not allow oxygen or $H_2O$ to penetrate the material at temperatures ranging from about 25° C. to about 430° C., at a TDL thickness of at least about 0.5 nanometers, such as a thickness of about 1 namometer to about 3 nanometers.

As used herein, the terms "essentially defect free" means that the number of defects on a 200 millimeter or 300 millimeter diameter wafer ranges from 0 to about 100, and that a piece of the substrate containing the interconnect structures shows no visual defects as viewed under a microscope at 10× to 10,000× magnification when said piece of said substrate has been heated in air to enhance the detection of said defects. A procedure that may be used to detect defects comprises: 1) passivating the top surface of the substrate with transparent silicon nitride (SiN) to prevent oxidation from the top surface, 2) breaking a piece of the substrate leaving exposed edges, 3) heating said piece in air for 1 to 100 hours at about 200° C. to about 430° C., which causes copper oxidation where defects exist in the liner barrier, and 4) inspecting said piece using a microscope.

As used herein, the terms "conformal deposition" describes the coverage of sidewalls in high aspect ratio holes (vias) or trenches, and requires a conformality of at least about 0.1, and preferably between about 0.1 and about 1. The conformality, on a substrate having a top surface and a via (hole) when a film is deposited on said substrate, is the ratio of the film thickness on the sidewalls of said via to the thickness on said top surface. The conformality=1 when the sidewall thickness equals the top surface thickness. The conformality of the TDL is preferably at least about 0.5, and more preferably ranges from about 0.9 to about 1.

The TDL 28 can for example, have a thickness of up to about 5 nanometers, meaning a finite amount of material up to about 5 nanometers in thickness, for example, from about 0.5 nanometers to about 5 nanometers, such as from about 1 nanometer to about 3 nanometers.

The TDL 28 should comprise a film that is comprised of a different material than the material of the ULK dielectric 26. A "different material than the material of the ULK dielectric" includes: (i) TDL materials that differ with materials used in the ULK dielectric with regard to the types of elements present (i.e. when the TDL material contains at least one element that is not present in the ULK dielectric and/or vice versa, such as when the TDL comprises an SiCNH composition and the ULK dielectric comprises an SiCOH composition) and (ii) TDL materials made up of the same elements as used in the ULK dielectric, where the stoichometric ratio of the elements differ (i.e. where the TDL material and the ULK dielectric are comprised of the same elements, but at least one composition coefficient differs, such as where both the TDL and ULK dielectric are represented by the formula $Si_xC_wO_yH_z$, where at least one of x, w, y, and/or z differ).

Suitable materials for the TDL 28 can include, for example, silicon nitride (SiN), SiC, SiCH, SiNH, SiCNH, SiCOH, AlN, BN, SiCBN, and mixtures, alloys, and multilayers of the same, wherein the elements of these compositions (Si, N, C, H, O, B, Al) can be present in any stoichiometric ratio. For example, preferred TDL materials include:

(i) a composition of formula:

$$Si_xO_wN_yH_z,$$

wherein x ranges from about 0.35 to about 0.45, w ranges from 0 to about 0.1, y ranges from about 0.45 to about 0.55, and z ranges from 0 to about 0.2;

(ii) a composition of formula:

$$Si_xO_vC_wN_yH_z,$$

wherein x ranges from about 0.2 to about 0.3, v ranges from 0 to about 0.1, w ranges from about 0.25 to about 0.35, y ranges from 0.1 to about 0.2, and z ranges from 0 to about 0.35; and (iii) a composition of formula:

$$Si_xC_wO_yH_z,$$

wherein x ranges from about 0.22 to about 0.32, w ranges from about 0.15 to about 0.3, y ranges from about 0.3 to about 0.5, and z ranges from 0 to about 0.3.

A highly preferred composition is $Si_xC_wN_yH_z$, where x=about 0.25, w=about 0.3, y=about 0.15, and z=about 0.3.

While the above values of x, y, w, z define preferred compositions, materials with other values of the x, y, w, z coefficients may be used within the invention to form the TDL.

The ULK dielectric of layer 26 can have a dielectric constant of up to about 3, meaning a dielectric constant of greater than zero up to about 3, such as a dielectric constant ranging from about 1.5 to about 3.0, and will preferably have a dielectric constant of less than about 3.0, and more preferably a dielectric constant of less than about 2.5. The ULK dielectric typically contains pores having characteristic dimensions ranging from about 0.5 nanometers to about 10 nanometers, such as from about 0.5 nanometers to about 2 nanometers.

Suitable ULK dielectrics for layer 26 can include porous inorganic materials such as, for example, silicon-containing materials such as compositions of Si, C,O, and H, including (SiCOH), also called C doped oxide (CDO) or organosilicate glass (OSG). Layer 26 can include ULK dielectrics deposited by plasma enhanced chemical vapor deposition (PE CVD), or by spin coating methods.

Specific examples of PE CVD ULK dielectrics include, but are not limited to, Black Diamond porous SiCOH (BDII, BDIII) from Applied Materials, and ULK or ELK Aurora from ASM. PE CVD from a SiCOH precursor and a second hydrocarbon precursor is one preferred method to make ULK SiCOH dielectrics with k between 1.5 and 3, as disclosed in U.S. Pat. Nos. 6,312,793, 6,441,491 and 6,479,110 B2, the entire disclosures of which are incorporated herein by reference.

A variety of spin applied films having the composition Si, C, O, H, such as, methylsilsesquioxanes, siloxanes and 5109, 5117, 5525, 5530 from Japan Synthetic Rubber (JSR), and Dendriglass may also be used. The materials known as Orion and other materials from Trikon and the material known as Zircon from Shipley may also be used for layer 26.

Alternatively, the ULK dielectric layer 26 may be a porous low-k organic material such as the commercially available porous organic thermoset from Dow Chemical Co. sold under the tradename porous SiLK, or polyarylene ethers, and the like.

Alternatively, the ULK dielectric layer 26 may be comprised of one material at the via level, and a second material at the line level, forming a "hybrid" structure known in the art. For example, the vias may be formed in a dense SiCOH dielectric and the lines maybe formed in a porous SiCOH dielectric.

Figure 3:
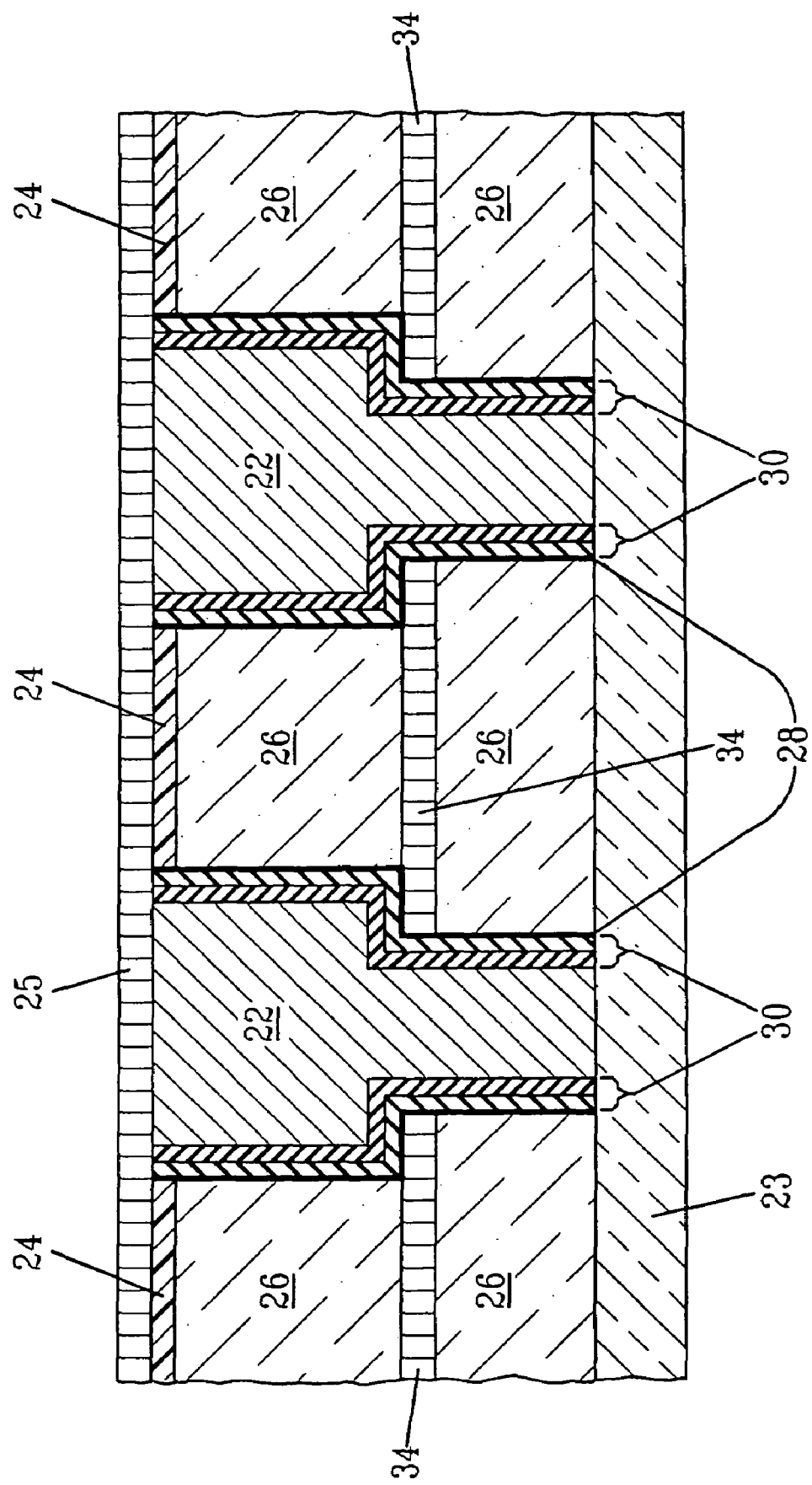
FIG. 3 shows a schematic cross-sectional view of a dual damascene interconnect level of the present invention with a buried etch stop layer, in which a TDL is shown between the ULK dielectric and the metal features.

Another embodiment falling within the scope of the present invention is now described with reference to FIG. 3, in which many elements are identical to FIG. 2 and the same number labels are used in FIGS. 2 and 3 for elements common to both. Added in FIG. 3 is a buried etch stop 34 at the bottom of the Cu lines. The etch stop 34 helps in forming the etched openings and helps to make the Cu lines have the precise correct resistance, and must have a composition that is different from the bulk ULK dielectric in order to give etch contrast.

Figure 4:
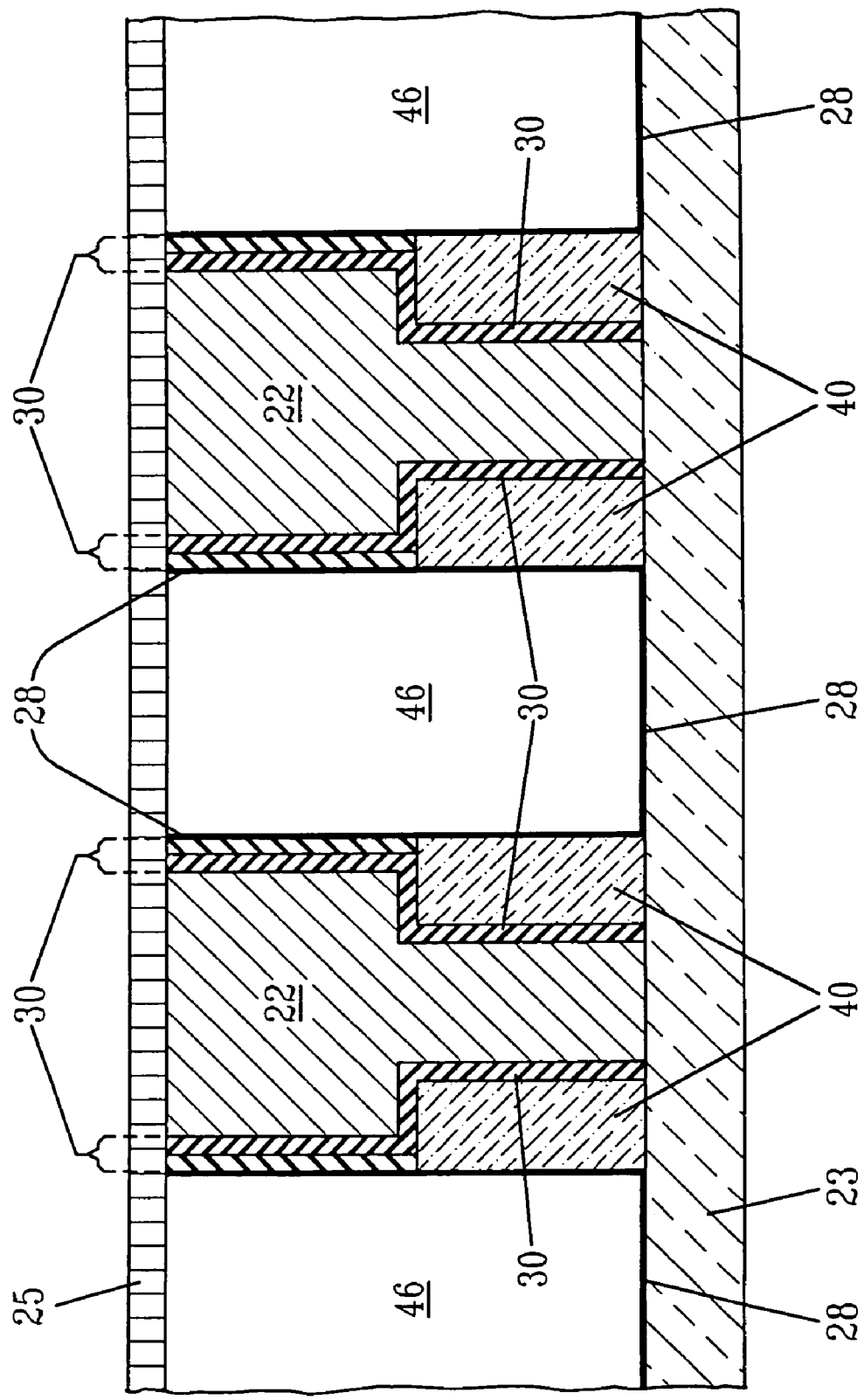
FIG. 4 shows a schematic cross-sectional view of an air gap interconnect level of the present invention, in which a TDL is shown between the air gap and the metal features as well as under the support dielectric.

An additional embodiment falling within the scope of the present invention is now described with reference to FIG. 4, in which an air gap structure is shown. The metal features 22, for example Cu lines, are supported by a support dielectric 40 that may be porous or dense. Any of the dielectric materials listed above in reference to FIG. 2 for layer 26 may be used within the invention for support dielectric 40. Outside the metal lines and the support dielectric is a thin dielectric layer 28. In this structure, layer 28 can comprise a dense material selected from the group consisting of SiN, SiCN, AlN, BN, SiCBN, and mixtures, alloys, or multilayers of the same.

The TDL 28 should comprise a dense, film having hermetic barrier capability that is preferably amorphous and essentially defect free, such as without pinholes or micro channels. In addition to having hermetic barrier capability, such film should preferably be a good barrier to Cu or Cu+ migration. Other properties of the TDL 28 preferably include: conformal deposition in the etched openings, especially at the bottom of vias, moisture ($H_2O$) resistance and/or hydrophobic character, and good adhesion to the liner layer and the blanket barrier/etch stop. The TDL may also have a low dielectric constant, for example, a dielectric constant of less than about 7, such as a dielectric constant ranging from about 2.8 to about 7.

The thickness of TDL 28 can, for example, range from about 0.5 nanometers to about 5 nanometers, such as from about 1 nanometer to about 3 nanometers. The conformality of the TDL is preferably at least about 0.5, and most preferably at least about 0.9.

Between the TDL 28 and the metal features 22 is a metal/metal nitride liner barrier 30, which may be a single layer or may be a bi- or multilayer, comprising, for example, TaN and/or Ta.

Next to the TDL is an air gap 46. The air gap 46 may be replaced with a porous gap filling dielectric to make an "etch back gap fill" (EBGF) structure, and EBGF structures containing a TDL are included within the invention.

The following further describes methods for making structures according to the invention.

First Method

The first method comprises the deposition of a TDL layer using a deposition process selected from, for example: high density plasma (HDP), downstream HDP, electron cyclotron resonance (ECR) assisted PE CVD, plasma enhanced atomic layer deposition (PE ALD) and related plasma processes.

The first method for sealing the pores and smoothing the via and line sidewalls begins by placing the substrate containing elements 1–17 of FIG. 1 in an HDP, PE CVD, PE ALD or electron cyclotron resonance plasma enhanced (ECR PE) CVD or an ALD type reactor. In the first method, a porous organosilicate glass (OSG), or "porous SiCOH", ILD is used, and a sealing layer comprising a material selected from the group consisting of SiN, SiC, or SiCN or SiCNH is applied, preferably by HDP or PE ALD. Other porous dielectrics listed above may be used within this method, and the ILD may be deposited by PE CVD or by spin coating techniques.

The pores in this material may have characteristic dimensions in the range of about 0.1 nanometer to about 10 nanometers, with the preferred material containing an average pore size ranging from about 0.2 nanometers to about 2 nanometers.

In this method, at least two or three precursor chemicals can be used in a mixture to form the TDL, and these can include a Si source and a nitrogen source and optionally a carbon source. Optionally, the Si and C are combined in 1 precursor (for example trimethylsilane or tetramethylsilane, or any methylsilane), and $NH_3$ or another precursor is used for the nitrogen source. HDP, downstream HDP, ECR PE CVD, PE ALD processes can all be used.

A typical High Density plasma (HDP) silicon nitride process comprises using dilute silicon, nitrogen, and a carbon source such as silane and ammonia (or nitrogen) and/or ethylene (or methane) as deposition precursors at low pressure (3–100 mT), low temperature (<400° C.) and low RF source and bias power (<800 watts for a 200 millimeter CVD system) to deposit the TDL comprised of either SiN, SiNC, or SiC with improved the film conformality. A typical system can be the AMAT Centura or Novellus SPEED HDP system. Other down stream plasma CVD, ECR can also be used for the same purpose.

The deposited films such as, for example, $SiN_x$, SiC and SiCN, should have high resistance to moisture and to oxidation at temperatures of up to 430° C. for 1 hour. The film's conformality should be at least about 0.5, and preferably at least about 0.9, for deposition over a submicron structure with at least a 1:1 aspect ratio.

Second Method

In the second method to form the TDL, the substrate containing elements 1–17 of FIG. 1 is placed on a cooled wafer chuck at a temperature of about 100 to about 300 Kelvin. A sealing agent is added to the process chamber as a gas or as evaporation from a solid source and the sealing agent condenses on the wafer. A molecule containing Si, C, O and H may be used as the sealing agent, such as tetramethylcyclotetrasiloxane, octamethylcyclotetrasiloxane, or other condensable siloxanes. These cyclic siloxane compounds are typically liquids under standard conditions and are preferred because these are easily condensed on the wafer to form a generally uniform and conformal coating on the etched sidewalls and trench bottom.

Preferred sealing agents include tetramethylcyclotetrasiloxane (TMCTS), octamethylcyclotetrasiloxane (OMCTS), derivatized cyclotrisiloxanes, derivatized cyclopentasiloxanes, ethyl substituted cyclic siloxanes, and derivatized siloxanes to make a SiCOH TDL layer.

Next, the sealing agent can be activated in an activation step, and this step reacts the sealing agent with the etched surfaces, and thus fills the open pores and rough areas. The activation step converts the sealing layer to the TDL, and the activation step must make a dense TDL layer.

In different embodiments, the activation step is performed with different energy sources. In the preferred embodiment the activation step is performed by exposing the substrate to electron beam irradiation or UV irradiation while the wafer temperature is maintained cold, such as a temperature ranging from about −200° C. to about 25° C. The electron beam treatment can use an electron energy ranging from about 0.5 to about 100 keV, with a dose of about 10 to about 1,000 microCuries/cm$^2$, at a time of about 1 second to about 170 minutes.

UV radiation may also be preferred to activate the sealing agent.

In a different embodiment, the wafer is heated to a temperature ranging from about 300° C. to about 450° C. for 1 to 10,000 seconds in vacuum or non-oxidizing reactive ambient such as hydrogen/argon or ammonia. The wafer may be lifted off the cold chuck using lift pins, and then lamp heated using rapid thermal anneal methods.

Alternatively, laser heating may be used to locally heat the top of the wafer for periods of 1 nanosecond to 100 seconds.

In another embodiment, the activation step may occur through exposure of the cold wafer to a plasma such as a downstream plasma or ECR plasma. One preferred chemistry for the plasma activation is to use $H_2$, hydrocarbons ($CH_4$, $C_2H_4$, etc.), ammonia ($NH_3$), He, or a mixture of one or more of these gases. Gases that may be used for plasma activation include, for example: forming gas ($H_2/N_2$), $H_2$/Inert gases (He, Ar,), $NH_3/H_2/N_2$, and hydrocarbons ($CH_4$, $C_2H_2$ . . . etc).

Third Method

In this method, a porous organosilicate glass (OSG), or "porous SiCOH", ILD can be used, and a sealing layer comprising SiN, SiC, or SiCN can be applied. The pores in this material may have characteristic dimensions in the range 0.1 nanometers to 10 nanometers, with the preferred material containing an average pore size of about 0.2 nanometers to about 2 nanometers.

In the third method, two or three materials are used in a mixture to form the TDL (sealing "layer"), and these include a Si source and a nitrogen source.

Process steps of the third method are similar to the second method. The substrate containing elements 1–17 of FIG. 1 is placed on a cooled wafer chuck at a temperature of about 100 to about 300 Kelvin. A sealing layer is added to the process chamber as a mixture of gases, and forms a condensed layer on the surfaces 9, 11, 17, as well as other surfaces of FIG. 1. Preferred sealing layers are formed by condensation of a higher silane (such as, for example, $Si_2H_6$ and/or $Si_3H_8$) with an N-containing molecule and optionally include a methylsilane such as trimethylsilane (3MS) or tetramethylsilane (4MS). The N-containing molecule may, for example, be $NH_3$, an alkyl amine such as methylamine, dimethylamine, and the like, or a nitrogen containing gas.

Any Si containing molecule that also contains either C or O may be used as 1 molecule to make the sealing layer. Also, a condensable silane molecule, including higher silanes such as $Si_3H_8$ or $Si_2H_6$ may be combined with $NH_3$ or another N containing compound to form an SiN TDL layer.

Next, the sealing layer is activated in the activation step, and this fills the open pores and rough areas.

The details of the activation step are the same as in the above Second Method.

Fourth Method

In this method, a porous organosilicate glass (OSG), or "porous SiCOH", ILD is used, and a thin dielectric layer (TDL) comprising SiN, SiC, or SiCN is applied. The pores in this material may have characteristic dimensions in the range 0.1 nanometer to 10 nanometers, with the preferred material containing an average pore size of 0.2 nanometers to 2 nanometers. In this method, standard atomic layer deposition (ALD) methods known in the art are used to deposit the TDL. The TDL comprises of SiN, SiCN, AlN, BN, and/or SiCBN, and must be dense.

The TDL 28 should comprise a dense, film having hermetic barrier capability that is preferably amorphous and essentially defect free, such as without pinholes or micro channels. In addition to having hermetic barrier capability, such film should preferably be a good barrier to Cu or Cu+ migration. Other properties of the TDL 28 preferably include: conformal deposition in the etched openings, especially at the bottom of vias, moisture ($H_2O$) resistance and/or hydrophobic character, and good adhesion to the liner layer and the blanket barrier/etch stop. The TDL may also have a low dielectric constant, for example, a dielectric constant of less than about 7, such as a dielectric constant ranging from about 2.8 to about 7, such as from about 2.8 to about 5.

The thickness of TDL 28 can, for example, range from about 0.5 nanometers to about 5 nanometers, such as from about 1 nanometer to about 3 nanometers. The conformality of the TDL is preferably at least about 0.5.

The above methods use a separate chamber to deposit the TDL. In related methods, an etch tool may be used in place of a deposition tool, and said etch tool can be connected to gas and liquid sources to form the TDL so the TDL is deposited as a final step in the etch process, after forming the etched damascene openings.

Although the invention has been described in its preferred form with a certain degree of particularity, many changes and variations are possible therein and will be apparent to those skilled in the art after reading the foregoing description. It is therefore to be understood that the present invention may be presented otherwise than as specifically described herein without departing from the spirit and scope thereof.

What is claimed as new and desired to be protected by Letters Patent of the United States is:

1. A back end of the line (BEOL) interconnect structure comprising:
    (a) an ultralow k (ULK) dielectric, having a dielectric constant of up to about 3, and conductive metal features provided on a substrate;
    (b) a liner barrier layer between said ULK dielectric and said conductive metal features; and
    (c) a thin dielectric layer (TDL), having a thickness of up to about 5 nanometers, between the liner barrier layer and the ULK dielectric, wherein the TDL comprises a dense dielectric film having hermetic barrier capability, said film comprising a different material than the material of the ULK dielectric, wherein said material comprises at least one material selected from the group consisting of:
    (i) materials of formula:

$Si_xO_wN_yH_z$, wherein x ranges from about 0.35 to about 0.45, w ranges from 0 to about 0.1, y ranges from about 0.45 to about 0.55, and z ranges from 0 to about 0.2;
    (ii) materials of formula:

$Si_xO_xC_wN_yH_z$, wherein x ranges from about 0.2 to about 0.3, v ranges from 0 to about 0.1, w ranges from about 0.25 to about 0.35, y ranges from about 0.1 to about 0.2, and z ranges from 0 to about 0.35; and
    (iii) materials of formula:

$Si_xC_wO_yH_z$, wherein x ranges from about 0.22 to about 0.32, w ranges from about 0.15 to about 0.3, y ranges from about 0.3 to about 0.5, and z ranges from 0 to about 0.3.

2. The interconnect structure of claim 1, wherein the TDL has a thickness ranging from about 0.5 nanometers to about 5 nanometers.

3. The interconnect structure of claim 2, wherein the TDL exhibits conformal deposition and is essentially defect free.

4. The interconnect structure of claim 1, wherein the TDL has a thickness ranging from about 1 nanometer to about 3 nanometers and a conformality that is at least about 0.5.

5. The interconnect structure of claim 4, wherein the TDL material is selected from the group consisting of silicon nitride (SiN), SiC, SiCH, SiNH, SiCNH, SiCOH, AlN, BN, SiCBN, CN, and alloys, mixtures, and multilayers of the same.

6. The interconnect structure of claim 1, wherein the TDL material comprises a composition of formula $Si_xO_wN_yH_z$, wherein x=about 0.25, w=about 0.3, y=about 0.15, and z=about 0.3.

7. The interconnect structure of claim 1, wherein the TDL is deposited by a method selected from the group consisting of: high density plasma (HDP), downstream HDP, electron cyclotron resonance (ECR), plasma enhanced chemical vapor deposition (PE CVD), assisted PE CVD, and plasma enhanced atomic layer deposition (PE ALD).

8. The interconnect structure of claim 5, wherein the liner barrier layer is selected from the group consisting of Ta, TaN, Ti, TiN, W, WN, and alloys, mixtures, and multilayers of the same; the ULK dielectric is selected from the group consisting of SiCOH and porous SiCOH materials with a dielectric constant ranging from about 1.5 to about 3.0; and the conductive metal features are selected from the group consisting of Cu, Al, Ag, Au, W, and alloys, mixtures, and multilayers of the same.

9. The interconnect structure of claim 8, wherein the liner barrier layer is selected from the group consisting of Ta, TaN, and alloys, mixtures, and multilayers of the same; and the conductive metal features comprise Cu.

10. The interconnect structure of claim 2, wherein the ULK dielectric has a dielectric constant ranging from about 1.5 to about 3.0; and the TDL has a dielectric constant ranging from about 2.8 to about 7.

* * * * *